US008310875B2

(12) United States Patent
Sakurai et al.

(10) Patent No.: US 8,310,875 B2
(45) Date of Patent: Nov. 13, 2012

(54) SEMICONDUCTOR MEMORY DEVICE

(75) Inventors: Katsuaki Sakurai, Yokohama (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,550

(22) Filed: Sep. 16, 2011

(65) Prior Publication Data

US 2012/0069662 A1 Mar. 22, 2012

(30) Foreign Application Priority Data

Sep. 22, 2010 (JP) ................................. 2010-212631

(51) Int. Cl.
 *G11C 11/34* (2006.01)
(52) U.S. Cl. ......... 365/185.17; 365/185.05; 365/185.11; 365/230.03
(58) Field of Classification Search ............. 365/185.17, 365/185.05, 185.11, 230.03
See application file for complete search history.

(56) References Cited

U.S. PATENT DOCUMENTS

2002/0034100 A1\* 3/2002 Sakui et al. .............. 365/185.22
2007/0252201 A1 11/2007 Kito et al.

FOREIGN PATENT DOCUMENTS

JP 2007-266143 10/2007

OTHER PUBLICATIONS

Ryota Katsumata, et al., "Pipe-Shaped Bics Flash Memory with 16 Stacked Layers and Multi-Level-Cell Operation for Ultra High Density Storage Devices", 2009 Symposium on VLSI Technology Digest of Technical Papers, Jun. 2009, 2 Pages.

\* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a semiconductor memory device includes memory cell units including serially-connected memory cells, which includes a semiconductor pillar and conductive and insulation films surrounding the semiconductor pillar. The memory cell units constitute blocks each of which is the minimum unit of data erasure. A pipe layer in at least one pair of adjacent first and second memory cell units of the memory cell units includes a semiconductor layer connected to the semiconductor pillars in the first and second memory cell units, and are connected to first ends of the first and second memory cell units. A conductive plate between the first ends of the first and second memory cell units and the semiconductor substrate contain the pipe layers of at least two blocks and controls conduction of the pipe layers. A supply path structure is connected to the plate and transmitting a potential the plate.

15 Claims, 10 Drawing Sheets

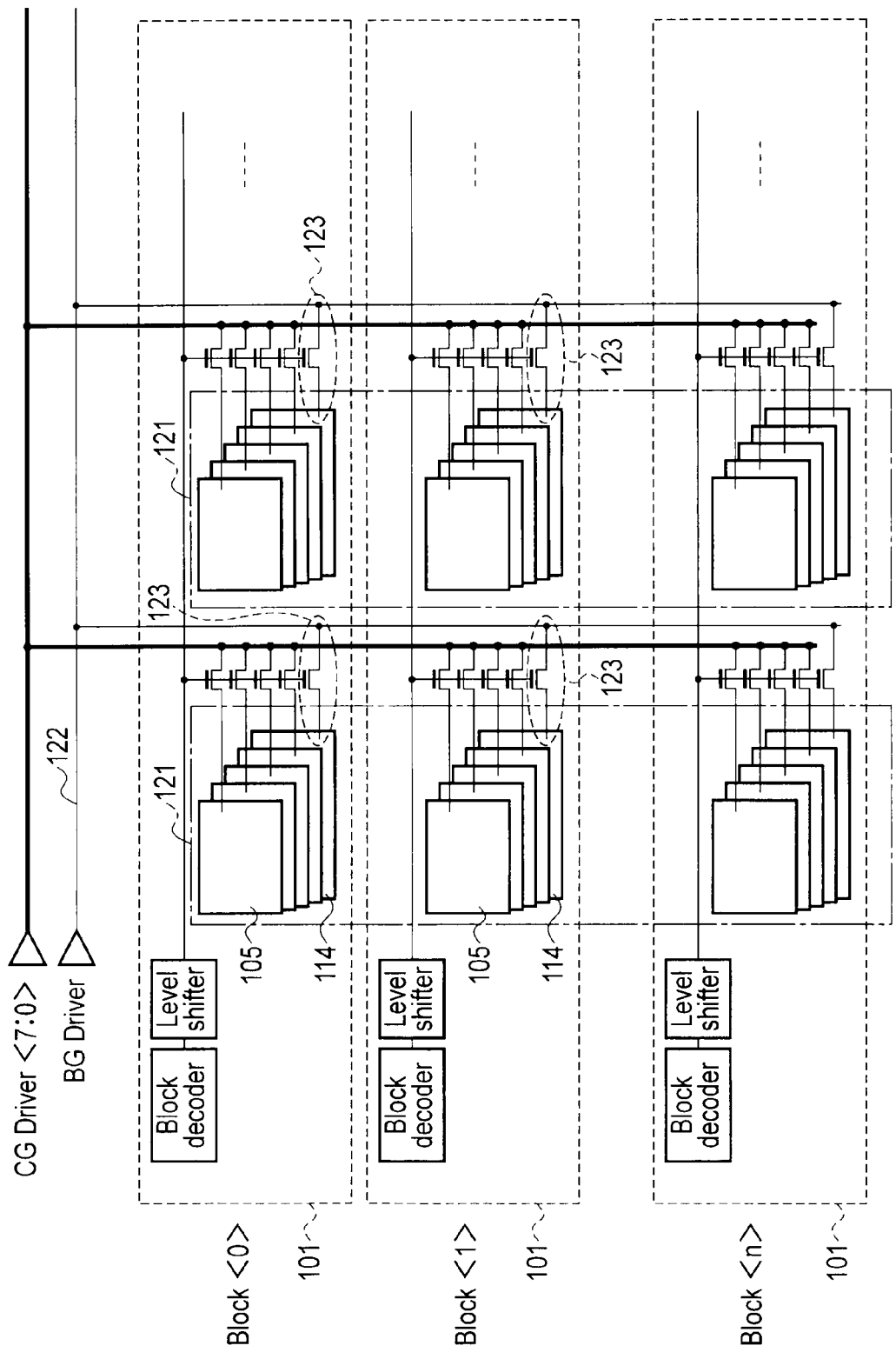
F I G. 2

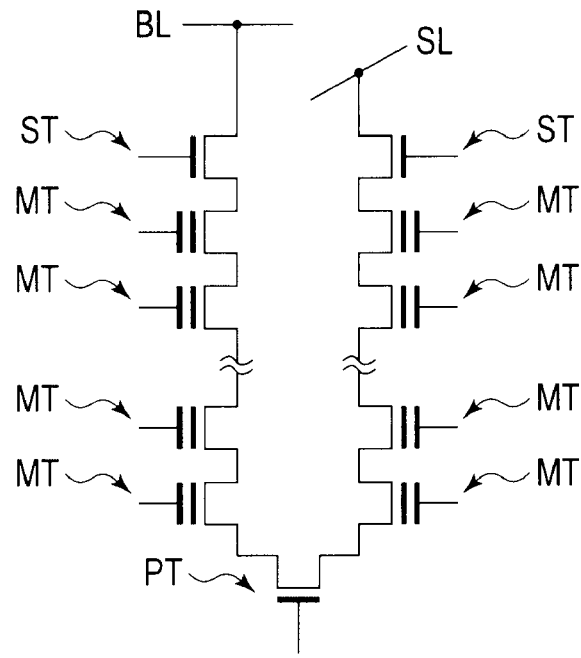
F I G. 6
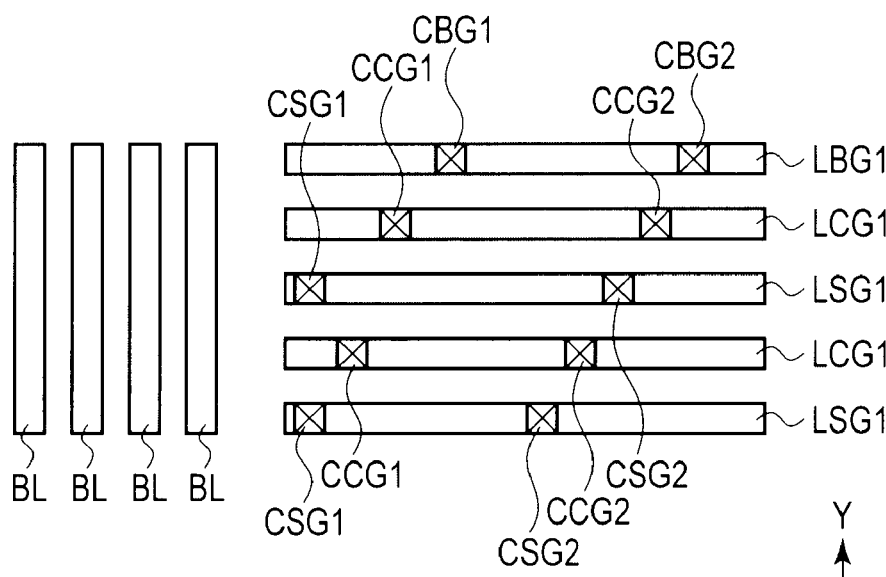
F I G. 7

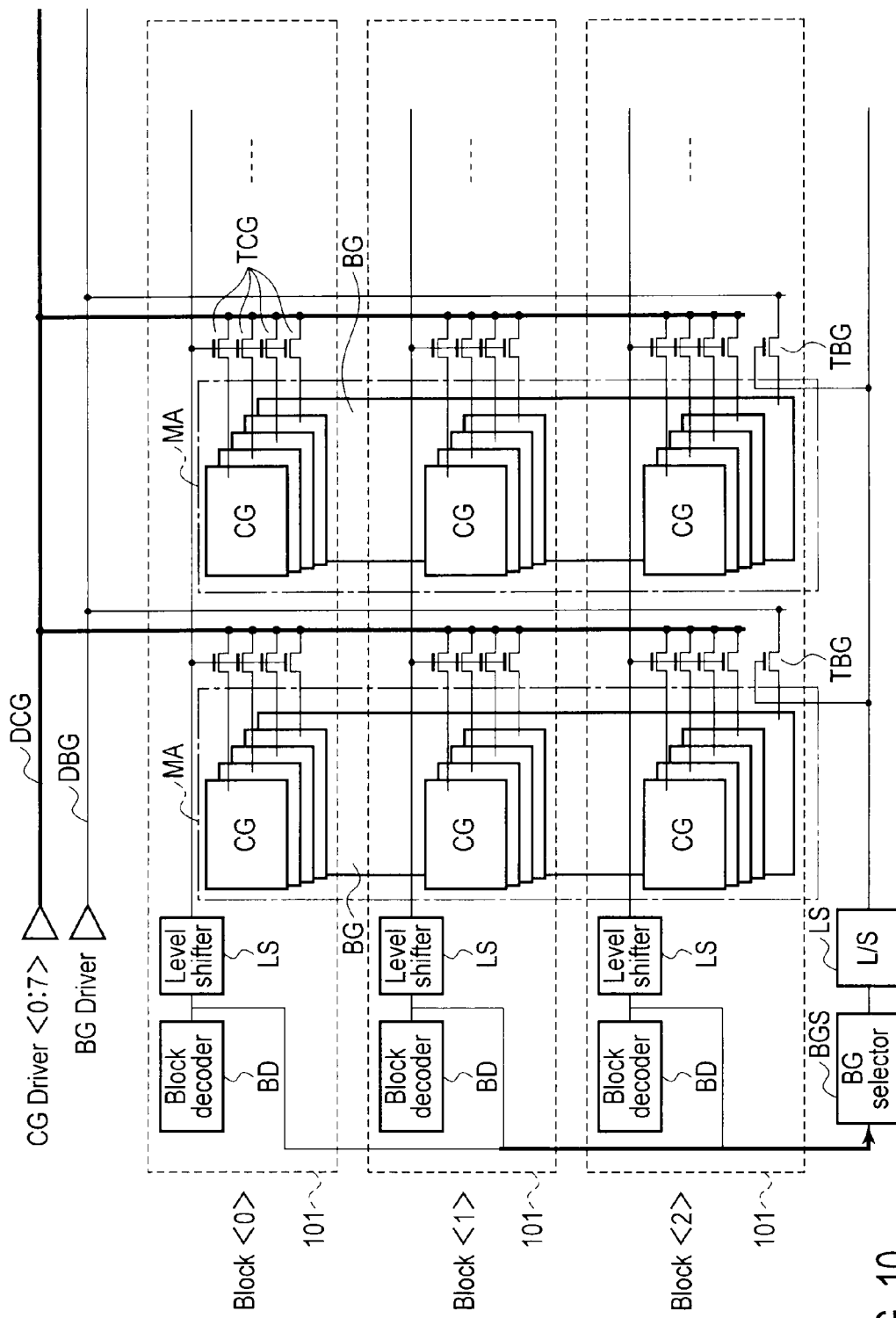
F I G. 10

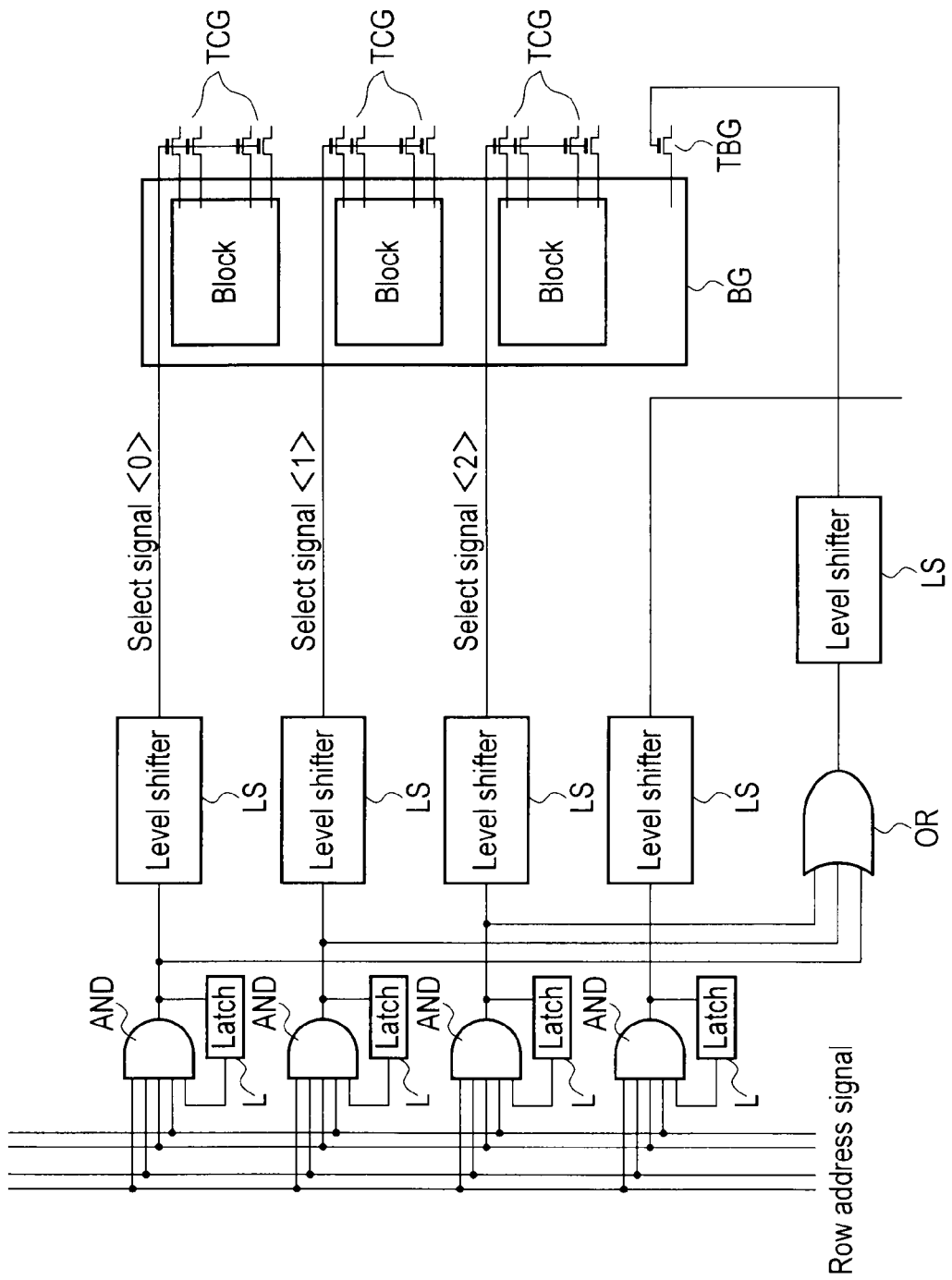
F I G. 11

SEMICONDUCTOR MEMORY DEVICE

CROSS-REFERENCE TO RELATED APPLICATIONS

This application is based upon and claims the benefit of priority from prior Japanese Patent Application No. 2010-212631, filed Sep. 22, 2010, the entire contents of which are incorporated herein by reference.

FIELD

Embodiments described herein relate generally to a semiconductor memory device.

BACKGROUND

So-called stack-type nonvolatile semiconductor memory devices are known. Such memory devices include the NAND flash memory which is manufactured by a manufacturing process of BiCS techniques. The manufacturing process of BiCS techniques include laminating gate electrodes and interlayer insulation films alternatively, forming holes through them from the top layer to the bottom layer, and burying the holes with impurity-doped silicon. As a result, the gate insulation layers surround each silicon pillar at intervals. With memory films such as silicon nitride films formed at the intersections of the pillar and gate insulation films beforehand, NAND memory cells can be formed. Serially-connected vertical transistors thus formed at the intersections of the electrode plates and a silicon pillar forms a memory string.

The NAND flash memory incorporating BiCS techniques (BiCS flash memory) includes of a so-called pipe type (p-BiCS flash memory). In the p-BiCS flash memory, the bottoms of a pair of adjacent memory strings are connected via a transistor called a pipe layer. The tops of the pair of the memory strings are connected to a bit line and a source line via a select gate, respectively.

The p-BiCS flash memory does not contain bottoms of the holes, and therefore a process for removing the memory film at the bottom of the hole is unnecessary, which results in such memory films unharmed and excel in reliability. Moreover, unlike a so-called line-type BiCS flash memory, select gate transistors and source lines are formed after a heating step for forming the memory films. For this reason, the characteristics of the select gate transistors can be improved, low-resistance metal source lines can be applied, and reading required for operation in a large-scale chip can be performed.

The p-BiCS flash memory can have higher integration than conventional NAND flash memories. However, much higher integration and simplified manufacturing process and design are always required for semiconductor devices. This also applies to the p-BiCS flash memory.

BRIEF DESCRIPTION OF THE DRAWINGS

FIG. 2 is a circuit diagram illustrating connection of a part of the example p-BiCS flash memory;

FIG. 6 illustrates an equivalent circuit diagram of connected two memory strings;

FIG. 7 is a plan view schematically illustrating a pattern of a D1 layer of one embodiment;

FIG. 10 schematically illustrates connection of main parts of the semiconductor memory device according to one embodiment; and FIG. 11 is a circuit diagram illustrating block decoders and a selector according to the semiconductor memory device according to one embodiment in detail.

DETAILED DESCRIPTION

In general, according to one embodiment, a semiconductor memory device includes memory cell units, a pipe layer, a plate and supply path structure. The memory units are above a semiconductor substrate, include serially-connected memory cells. The memory cells include a semiconductor pillar and conductive and insulation films surrounding the semiconductor pillar and are configured to store data non-volatilely. The memory cell units constitute blocks each of which is the minimum unit of data erasure. The pipe layer is in at least one pair of adjacent first memory cell unit and second memory cell unit of the memory cell units, includes a semiconductor layer connected to the semiconductor pillars in the first and second memory cell units, and is connected to first ends of the first and second memory cell units. The plate is conductive, is between the first ends of the first and second memory cell units and the semiconductor substrate, contains the pipe layers of at least two blocks, and controls conduction of the pipe layers. The supply path structure is connected to the plate and transmitting a potential the plate.

EXAMPLE FOR REFERENCE

Prior to description of embodiments, description will be given of an example of a semiconductor memory device including stack-type transistors, in particular a p-BiCS flash memory, with reference to FIG. 1.

Figure 1:
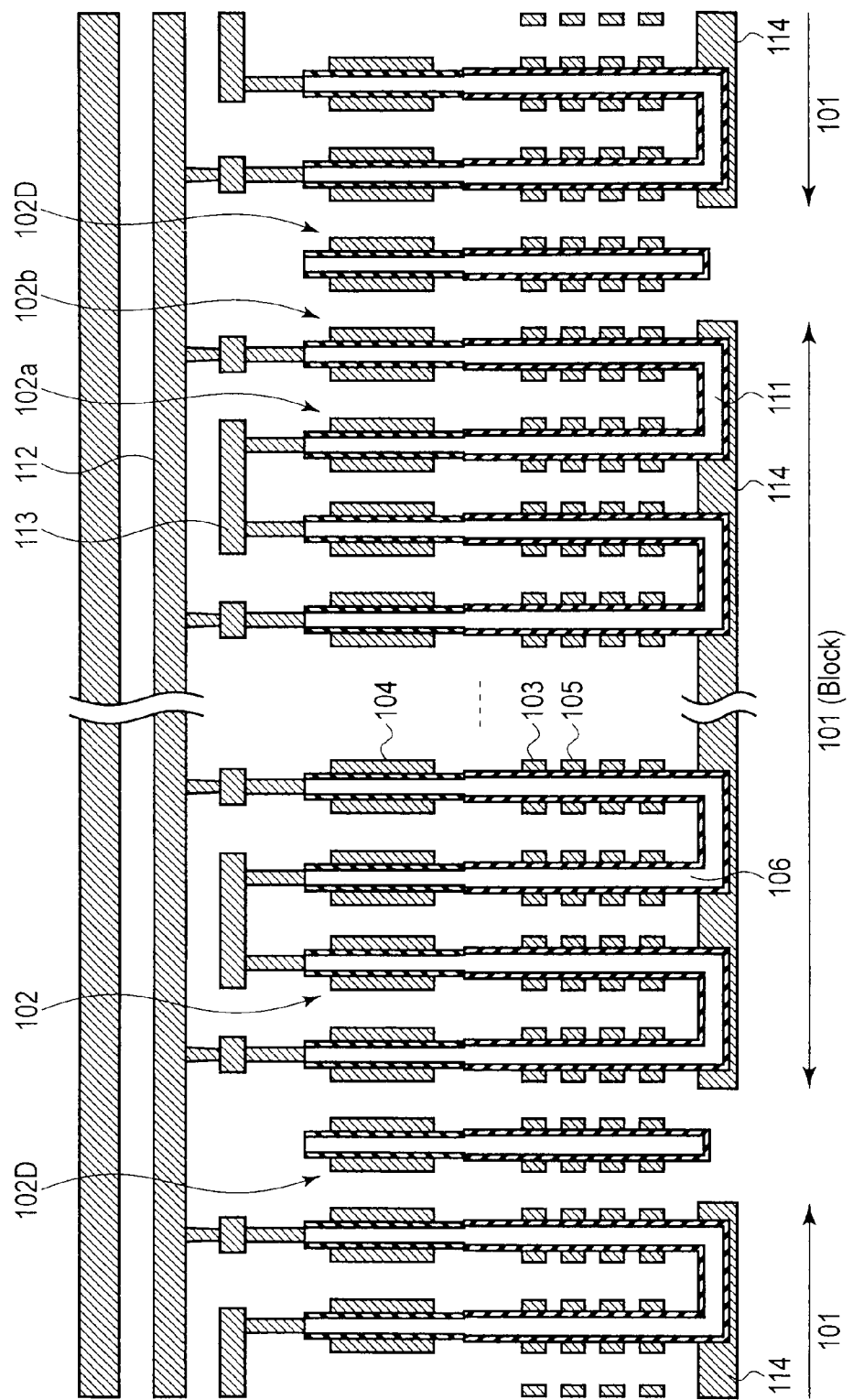
FIG. 1 schematically illustrates a sectional view of an example p-BiCS flash memory for reference.

FIG. 1 schematically illustrates a sectional view of an example p-BiCS flash memory for reference. Blocks 101 are disposed as shown in FIG. 1. Each block 101 corresponds to a data-erasure unit. That is, a subject of one data-erasure process is all the memory cell transistors in one block. Each block 101 includes memory strings (NAND strings) 102, each of which includes serially-connected memory cell transistors 103 and a select gate transistor 104. Each memory cell transistor 103 is configured to be a so-called stack-type transistor, which includes a tunnel insulation film, an electron-trapping film, an inter-electrode insulation layer, a control gate electrode, and a semiconductor area, etc. The control gate electrode has a rectangle plane shape (geometry) and is called a control gate plate 105 hereinafter. A plurality of such a control gate plate 105 are stacked at intervals in a direction which starts from a semiconductor substrate (not shown). There is disposed an impurity-doped semiconductor pillar 106, which penetrates through the control gate plates 105 and in which a channel and source/drain regions will be formed.

Two adjacent memory strings 102*a* and 102*b* constitute a pipe structure. In each pipe structure, the memory strings 102*a* and 102*b* are connected by a pipe layer 111 at their bottoms. One of the memory strings in pipe structure 102*a* is connected to a source line 113 at its top. The other one of the memory strings 102b is connected to a bit line 112 at its top. The pipe layer 111 is buried in a back gate line 114. The back gate line 114 has a rectangular plane shape (geometry) and is called a back gate plate. The pipe layer 111 electrically connects and disconnects the memory strings 102a and 102b to which it is connected, based on the potential of the back gate plate 114. Each pipe structure shares the source line 113 with an adjacent pipe structure. One back gate plate 114 is common for one block 101. That is, all pipe layers 111 in one block 101 are formed in one back gate plate 114 for the corresponding block 101. Back gate plates 114 for different block 101 are separated from each other.

In each boundary of the blocks 101, a dummy memory string 102D is disposed. The dummy memory string 102D is made to float electrically, and does not serve for storing data. Without dummy memory strings 102D, distances between blocks 101 would be very narrow, it would be difficult to form the structure, and the periodicity of arrangement of the memory strings 102 would be disturbed. As a countermeasure for them, the dummy memory strings 102D are disposed to maintain the distances between blocks 101 and the periodicity.

FIG. 2 is a circuit diagram showing connection of components in a part of the p-BiCS flash memory of FIG. 1. As shown in FIG. 2, the flash memory has several memory cell arrays 121, each of which includes blocks 101. Memory cell arrays 121 are controlled independently from another and the blocks in each memory cell array 121 (for example, blocks <0>) are also independent from another. Therefore, blocks belonging to separate memory cell arrays 121 are separate.

Each block 101 has a back gate plate 114 at its bottom, and control gate plates 105 at intervals above the back gate plate (or in a direction away from the substrate). The control gate plates 105 are selectively connected to a CG driver.

The back gate plates 114 are selectively connected to a BG driver via a corresponding transistor and a BG driver line 122. The Back gate plates 114 are controlled individually, and therefore the number of back gate control structures 123, which include the transistor and interconnects, between a back gate plate 114 and the BG driver line 122 is equal to that of the back gate plates 114, i.e., the number of blocks 101. Such a number according to one example is 4000 per one chip at the time of the application of the present application. There are in turn 4000 back gate control structures. Areas for suitably arranging such many structures must be secured in a limited area. Thus, there is a need for a semiconductor memory device, especially a p-BiCS flash memory with much reduced area.

Description will now be given for embodiments configured in accordance with such study with reference to drawings. In the following, the same components are indicated with the same reference numbers throughout the figures, and repetitive description will be given only when required. Note that the drawings are merely illustrative and a ratio of the relation between a thickness and a geometry of a layer and thicknesses among layers may differ from an actual one. Therefore, a specific thickness and size should be determined in light of the following description. The drawings naturally include portions which differ in size or a size relative to another portion among drawings.

Embodiments shown in the following is presented for illustrating devices and methods for embodying the technical idea of such embodiments, and therefore the technical idea of embodiments should not be limited to the following material, form, structure, and arrangement of components, etc. The technical idea of embodiments can be modified within a scope of claims.

EMBODIMENT

Figure 3:
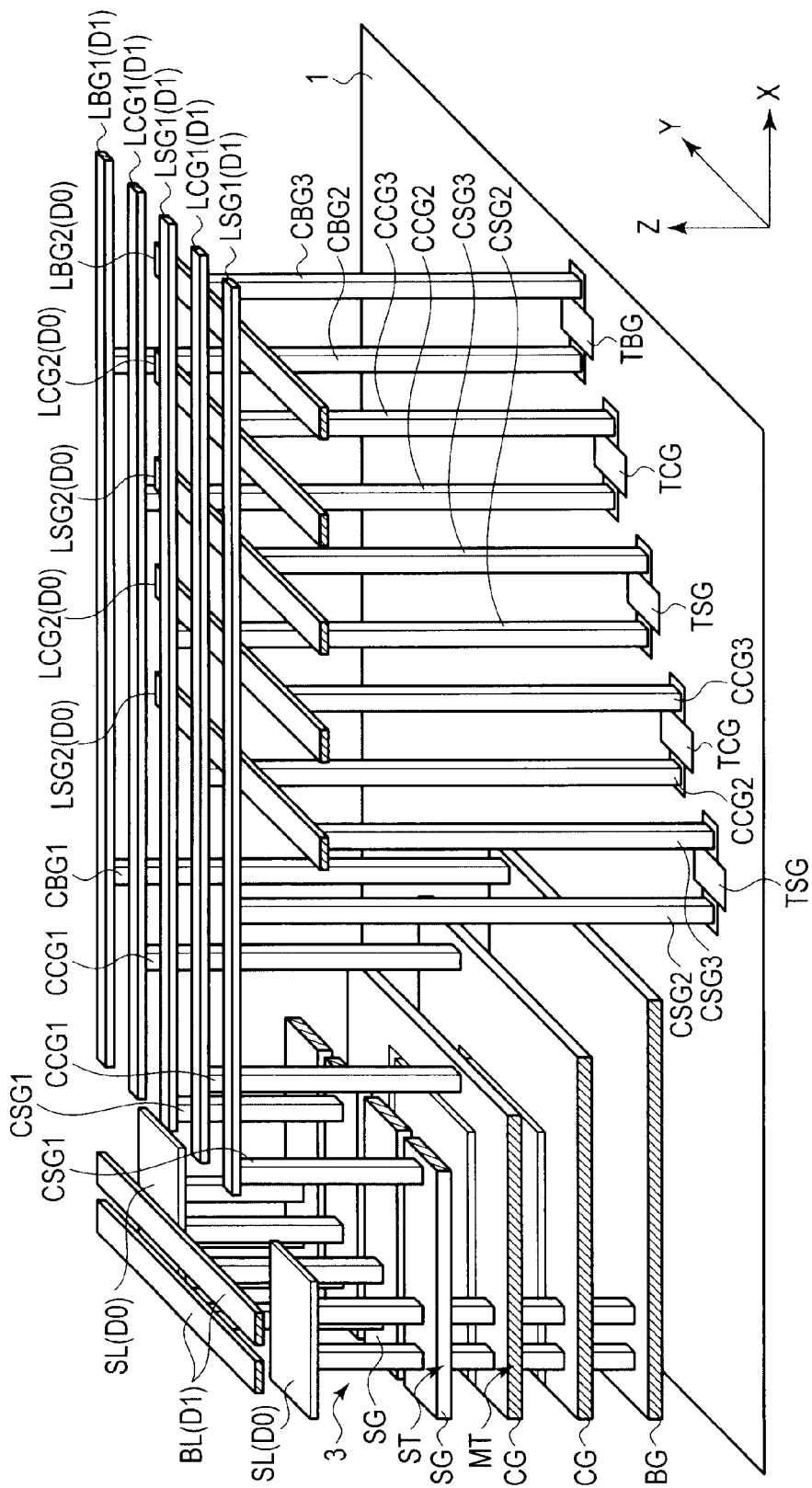
FIG. 3 is a perspective view schematically illustrating a semiconductor memory device according to one embodiment.
Figure 4:
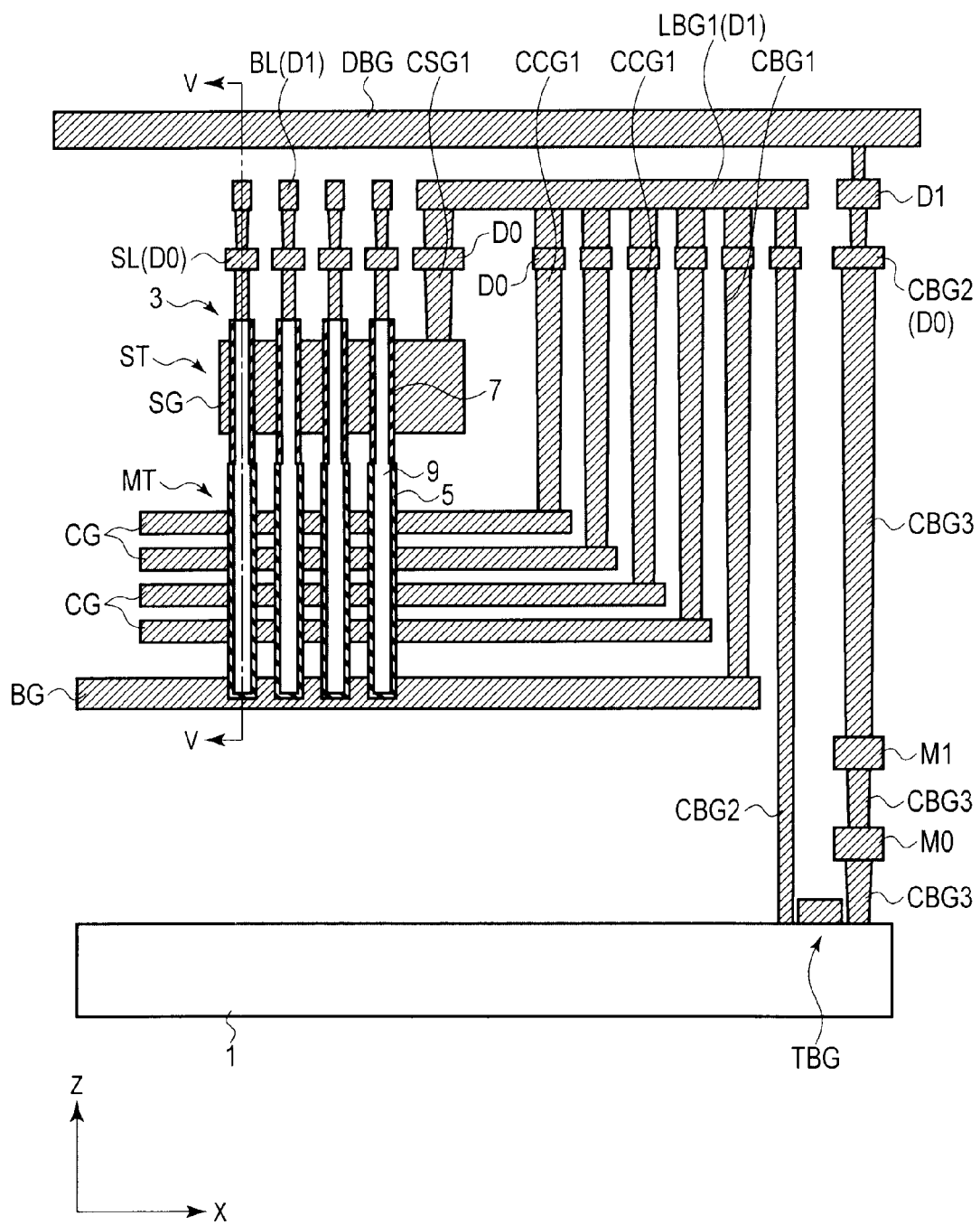
FIG. 4 is a sectional view taken along the x-axis in FIG. 3.
Figure 5:
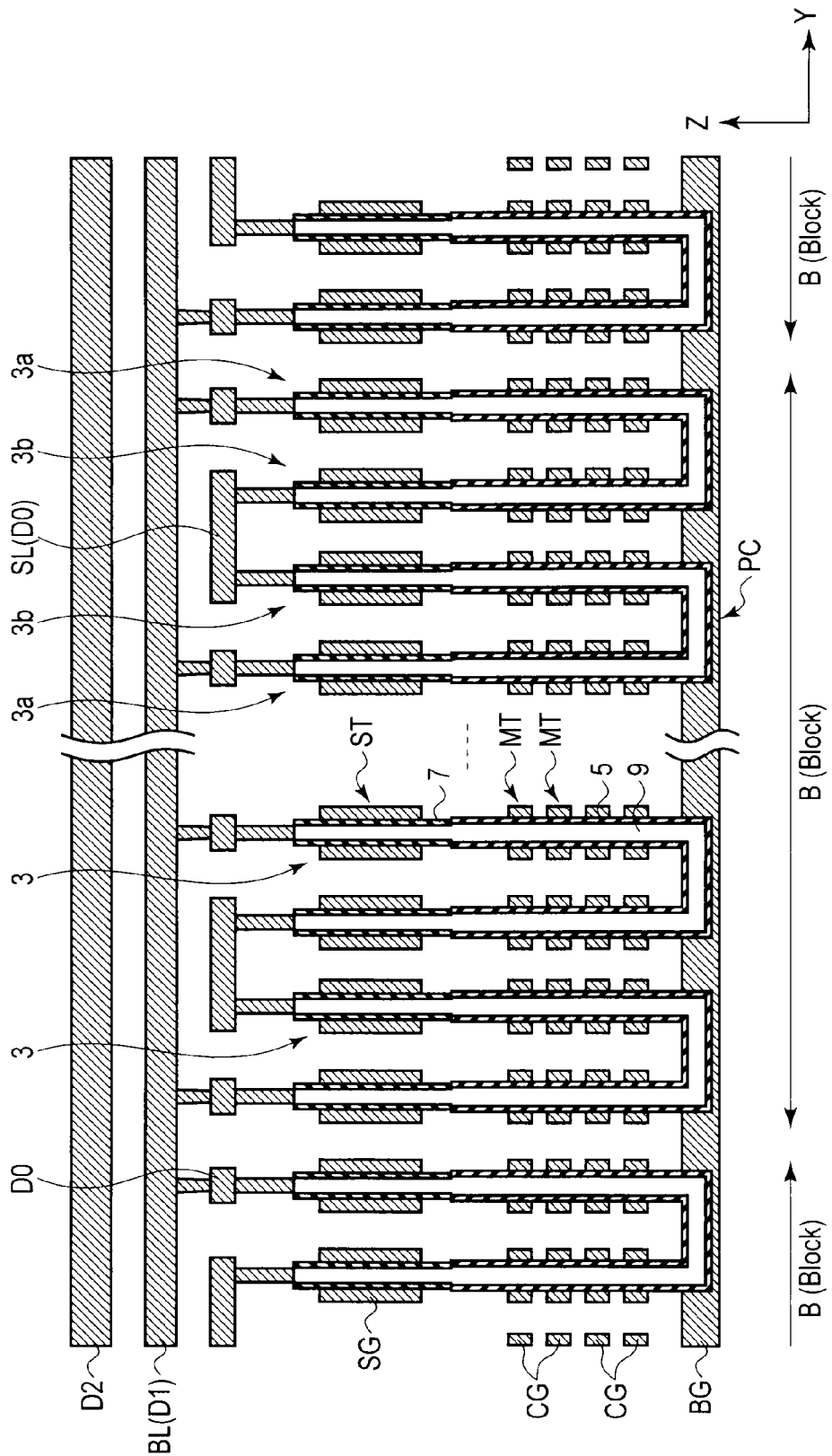
FIG. 5 is a sectional view taken along the z-axis in FIG. 3 or line V-V in FIG. 4.

FIG. 3 is a perspective view schematically illustrating a semiconductor memory device according to one embodiment. FIG. 4 is a sectional view taken along the x-axis of FIG. 3. FIG. 5 is a perspective view schematically illustrating the semiconductor memory device according to one embodiment, and is a sectional view taken along the z-axis of FIG. 3 or line V-V of FIG. 4.

As shown in FIGS. 3 to 5, a back gate plate BG is formed above, or above in a direction along the x-axis, a semiconductor substrate surface 1. The back gate plate BG has a plane shape (geometry) which extends along the xy plane. Multiple control gate plates CG are disposed at intervals above, or above in a direction along the z-axis, back gate plate BGM. Each control gate plate CG has a plane shape (geometry) which extends along the xy plane. A control gate plate CG located higher has a smaller geometry. FIGS. 3, 4 and FIG. 5 only illustrate 2, 4, and 4 control gate plates CG, respectively, for the purpose of clarification of figures. A select gate plate SG is formed above the topmost control gate plate CG. The select gate plate CG has a plane shape (geometry) which extends along the xy plane.

Multiple memory strings (NAND string) 3 are formed through the select gate plate SG and control gate plates CG. The memory strings 3 extend along the z-axis. Each memory string 3 includes serially-connected memory cell transistors MT and a select gate transistor ST. Memory cell transistors MT which are in line along the x or y-direction constitute a page. The semiconductor memory device is configured to write or read data in unit of pages. Pages in turn constitute a block, and the semiconductor memory device is configured to erase data in units of blocks.

Multiple holes are disposed along the z-direction through the select gate plate SG and control gate plates CG. These holes reach inside of the back gate plate BG. Each hole is provided with stacked films 5, which includes a tunnel insulation film, an electron-trapping film, and an inter-electrode insulation film, on the internal surface of the hole in a region lower than the topmost control gate plate CG. Each hole is also provided with a gate insulation film 7 on the internal surface of the hole in a region above the stacked films 5. The inside of holes is buried with semiconductor material 9. The semiconductor material 9 is of impurity-doped silicon, for example. The electron-trapping film is also called an electron-storage film, etc.

In a portion surrounded by the control gate plate CG, the semiconductor material 9, stacked films 5, and control gate plate CG together realize a memory cell transistor MT which has the same configuration as a so-called stacked-gate transistor. In contrast, in a portion surrounded by the select gate plate SG, the semiconductor material 9, gate insulation film 7, and select gate plate SG together realize a select gate transistor ST. Multiple memory cell transistors MT and a select gate transistor ST are connected in series along the z-axis to constitute the memory string 3 described above.

Two memory strings 3a and 3b constitute a pipe structure. In each pipe structure, the memory strings 3a and 3b are connected by a pipe layer PC at their bottoms. The pipe layer PC is formed in the back gate plate BG, and is configured in part by the semiconductor material 9. The pipe layer PC realizes a transistor, and electrically connects or disconnects the memory strings 3a and 3b to which it is connected, based on the potential of the back gate plate BG. One of each memory strings in the pipe structure 3b is connected to a source line SL at its top. The source line SL extends along the y-axis, and is realized by a pattern in a D0 layer located above the select gate plate SG. The other one of the memory strings in the pipe structure 3a is connected to a bit line BL at its top via independent pattern in the D0 layer (omitted in FIG. 3). The Bit lines extend along the y-axis, are realized by patterns in a D1 layer located above the D0 layer, and are separate from each other along the x-axis. Each pipe structure shares the source line SL with an adjacent pipe structure, and is commonly connected to the bit line BL.

As described, two memory strings are connected by a transistor in their respective ends opposite the select gate transistors ST. The equivalent circuit is as shown in FIG. 6. Two sets of serially-connected memory cell transistors MT are connected by a transistor PT, and the select gate transistor ST is connected to both ends of thus connected series structure of the memory cell transistors MT and the transistor PT as shown in FIG. 6. One of the select gate transistors ST is connected to the source line SL, and the other one of the select gate transistors ST is connected to the bit line BL. This structure is identical to a NAND string of the NAND flash memory except for the transistor PT. The transistor PT corresponds to the back gate plate BG. The control gate electrodes of the memory cell transistors MT correspond to the control gate plates CG. The gate electrodes of the select gate transistors ST correspond to the select gate plate SG.

Each control gate plate CG is connected to a corresponding plug CCG1 at its end as shown in FIGS. 3 to 5. The plug CCG1 is connected to a corresponding signal line LCG via a D0-layer independent-pattern (omitted in FIG. 3). Each select gate plate SG is connected to a plug CSG1 at its end. The plug CSG1 is connected to a corresponding signal line LSG via a D0-layer independent-pattern (omitted in FIG. 3). The back gate plate BG is connected to a plug CBG1 at its end. The plug CBG1 is connected to a signal line LBG via a D0-layer independent pattern (omitted in FIG. 3).

The signal lines LCG, LSG, and LBG extend along the x-axis, are realized by patterns in the D1 layer, and separate from each other along the y-axis as shown also in FIG. 7. In contrast, the bit lines BL, which are also realized in the D1 layer, extend along the y-axial direction.

As shown in FIGS. 3 to 5, interconnects LCG1, LSG1, and LBG1 are connected to one of source/drain regions of transistors TCG, TSG, and TBG via plugs CCG2, CSG2, and LBG2, which extend along the z-axis, respectively. The transistors TCG, TSG, and TBG are formed on the surface of the substrate 1. The other one of the source/drain regions of each of the transistors TCG, TSG, and TBG are connected to interconnects LCG2, LSG2, and LBG2 via plugs CCG3, CSG3, and CBG3, which extend along the z-axis, respectively. The interconnects LCG2, LSG2, and LBG2 extend along the y-axis, and are realized by patterns in the D0 layer. In fact, the plugs CCG3, CSG3, and CBG3 are realized by independent patterns in an M0 layer and an M1 layer, and plugs which connect theme as shown in FIG. 4. Interconnects LCG2 and LBG2 are connected to a CG driver line DCG and a BG driver line DBG, respectively, via plugs and independent interconnect patterns.

Figure 8:
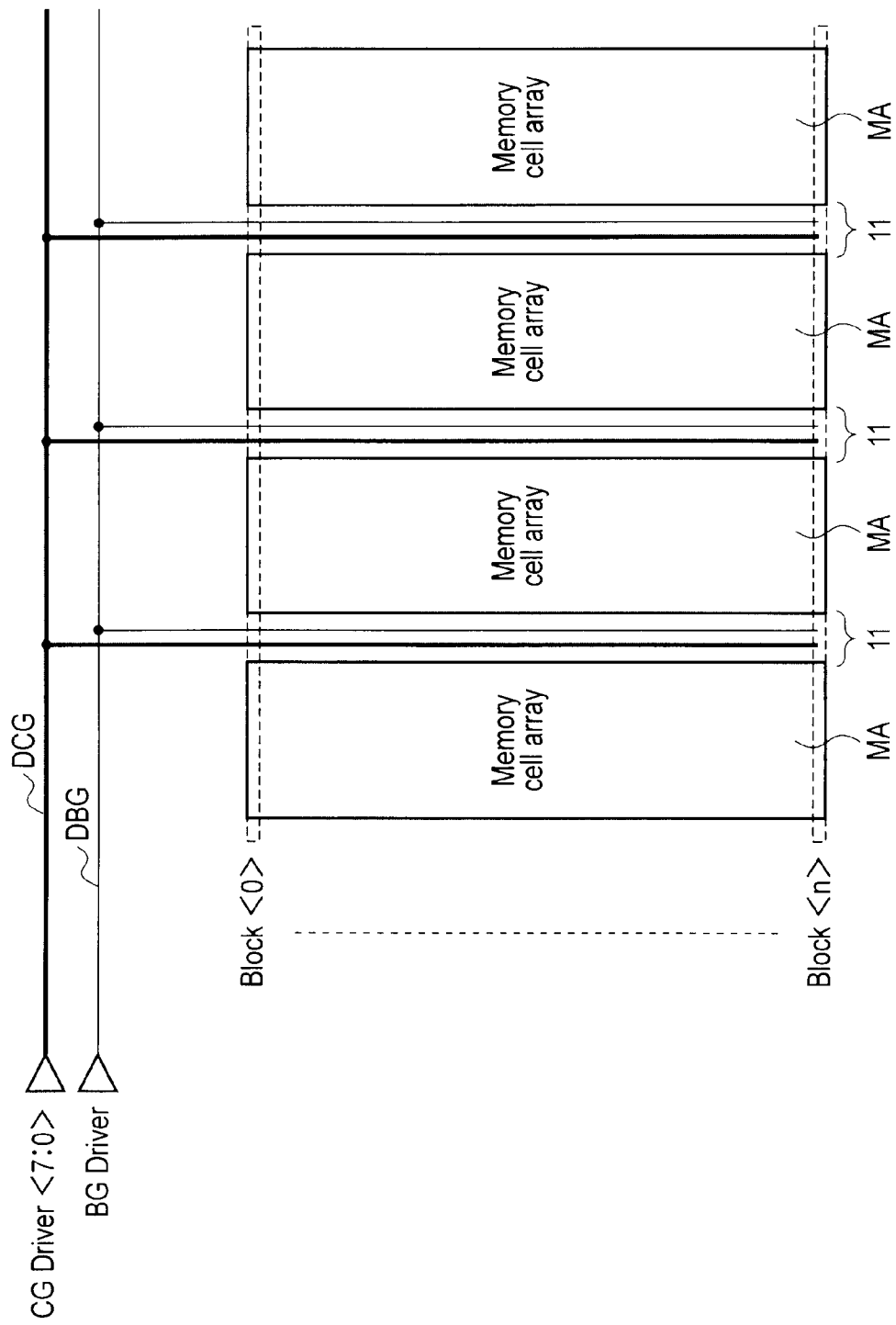
FIG. 8 is a plan view of the semiconductor memory device according to one embodiment.
Figure 9:
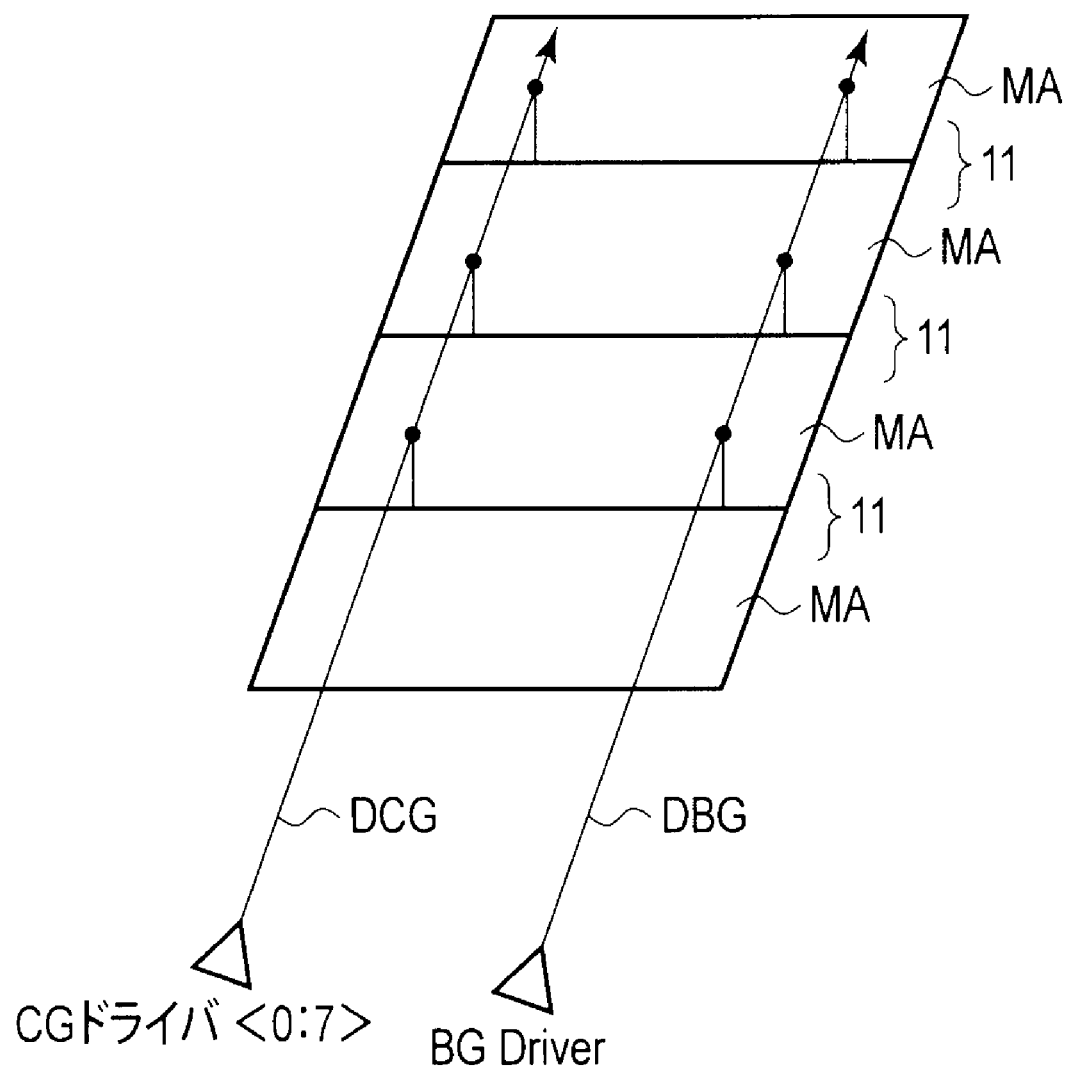
FIG. 9 is a plan view schematically illustrating a pattern of a D2 layer of one embodiment.

Respective sets of the transistors TCG, TSG, and TBG are disposed in areas 11 between memory cell arrays MA as shown in FIG. 8. On one chip, several memory cell arrays MA (for example, 4 as shown in FIG. 8) are disposed. The topmost block in each memory cell array MA is defined as a block <0>, and the lowermost one as a block <n>. One end of each of the transistors TCG and TBG is connected to the CG driver line DCG and the BG driver line DBG via plugs CCG3 and CBG3 and interconnects LCG2 and LBG2, respectively, as described above. The CG driver line DCG and the BG driver line DBG are provided with predetermined voltages by drivers in a peripheral circuit (not shown), which is located outside the memory cell arrays MA as shown in FIG. 9. FIG. 9 is a perspective view illustrating D2 interconnects.

The back gate plate BG is shared by multiple blocks B as shown in FIG. 5. That is, a back gate plate BG extends below, or below in a direction along the z-axis, blocks B. Therefore, the potential of one back gate plate BG is common to blocks B which share the corresponding back gate plate BG. This regard will be described below.

FIG. 10 schematically illustrates connection of components of a apart of the semiconductor memory device according to one embodiment. As shown in FIG. 10 and described above, in each memory cell array MA, each block B includes multiple control gate plates CG. Control gate plates CG are electrically connected to the CG driver line DCG via respective transistors TCG. The transistors TCG are controlled by decoders BD provided for each block B. Each block decoder BD turns on a selected transistor TCG in response to a received external address signal selecting a block B corresponding to that block decoder BD. Level shifters LS serve for shifting signals from the block decoders BG to have potentials required for driving the transistors TCG. As described above, multiple (three are illustrated in the figure) blocks B in the same memory cell array MA share a back gate plate BG. For this reason, a configuration for controlling the potential of the back gate plate BG does not need to be provided for each block B. Therefore, in the example where a back gate plate BG is shared by three blocks B as in FIG. 10, the contacts CBG1 and CBG2, interconnect LBG1, and transistor TBG are provided only in block <2> among block <0> to block <2>. Therefore, FIG. 3 is equivalent to the configuration of block <2> of FIG. 10.

The gates of the transistors TBG are controlled by the back gate selector (BG selector) BGS. A level shifter LS connected to the BG selector BGS serves for shifting signals from the back gate selector BGS to have the potential required for driving the transistors TBG. When BG selector receives a signal from the block decoders for selecting a block B, it is activated to output a signal to select a back gate BG that is shared by the selected block. However, if a selected block B is a bad block, the corresponding block select signal is not output from the corresponding block decoder BD as will be described.

As described, since one back gate plate is shared by blocks B, only one set of switches and interconnects for controlling the back gate plate BG is necessary for blocks that share the back gate plate. Therefore, the configuration can be simplified by such reduced components.

FIG. 11 is a circuit diagram illustrating the block decoders BD and BG selector BGS in detail. Block decoders BD are provided for respective blocks B, and includes respective AND gates AND as shown in FIG. 11. AND gates AND receive a row address signal. One gate AND selected based on the row address signal supplies an asserted signal to the level shifter LS.

Latches L are provided for respective blocks B. When a block is a bad block, the corresponding latch L stores data indicative of such information and supplies it to the corresponding AND gate. Therefore, when a bad block is selected, the laces prohibit the corresponding AND gate AND for the bad block from outputting the asserted signal.

The BG selector BGS includes an OR gate OR, for example. The OR gate OR receives the output of AND gates AND for blocks B that share one back gate plate BG. Therefore, when any one of blocks B that share one back gate plate BG is selected, a transistor TBG turns on by the asserted signal from the OR gate OR.

As described above, according to the semiconductor memory device of one embodiment, back gate plates are shared by multiple blocks. For this reason, there are fewer set of components (interconnects, transistors, and plugs, etc.) for controlling one of the back gate plates than the total number of blocks to result in a simplified configuration of the semiconductor memory device. Specifically, the ratio for reduction is equal to (number of blocks sharing one back gate plate)/(number of blocks).

Moreover, the back gate plates are not divided for each block. This eliminates the necessity for providing extra areas for securing an enough distance between back gate plates in boundaries of back gates, which can reduce the area of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    memory cell units above a semiconductor substrate including serially-connected memory cells, the memory cells including a semiconductor pillar and conductive and insulation films surrounding the semiconductor pillar and configured to store data non-volatilely, the memory cell units constituting blocks each of which is the minimum unit of data erasure;
    a pipe layer in at least one pair of adjacent first memory cell unit and second memory cell unit of the memory cell units, the pipe layer including a semiconductor layer connected to the semiconductor pillars in the first and second memory cell units, and connected to first ends of the first and second memory cell units;
    a conductive plate between the first ends of the first and second memory cell units and the semiconductor substrate, the plate containing the pipe layers of at least two blocks and controlling conduction of the pipe layers; and
    a supply path structure connected to the plate and transmitting a potential the plate.

2. The device of claim 1, wherein only one supply path structure is provided for the plate.

3. The device of claim 2, wherein the supply path structure includes a plug, a transistor, and an interconnect.

4. The device of claim 3, wherein the first and second memory cell units are included in the same block.

5. The device of claim 4, wherein two of the memory cell units at a boundary of two adjacent blocks adjoin each other.

6. The device of claim 3, wherein the transistor turns on in response to a select signal for selecting one of the at least two blocks.

7. The device of claim 6, wherein
    the select signal is output from a decoder provided for each of the at least two blocks,
    the decoders output the select signal based on a received address signal, and
    output of the select signal from one decoder is prohibited regardless of the address signal when one block corresponding to the one decoder is a bad block.

8. The device of claim 1, wherein
    the device includes memory cell arrays including a subset of the memory cell units, and
    each memory cell array includes only one plate.

9. The device of claim 8, wherein each plate contains pipe layers in all the blocks included in a corresponding memory cell array.

10. The device of claim 9, wherein only one supply path structure is provided for the plate.

11. The device of claim 10, wherein the supply path structure includes a plug, a transistor, and an interconnect.

12. The device of claim 11, wherein the first and second memory cell units are included in the same block.

13. The device of claim 12, wherein two of the memory cell units at a boundary of two adjacent blocks adjoin each other.

14. The device of claim 11, wherein the transistor turns on in response to a select signal for selecting one of the at least two blocks.

15. The device of claim 14, wherein
    the select signal is output from a decoder provided for each of the at least two blocks,
    the decoders output the select signal based on a received address signal, and
    output of the select signal from one decoder is prohibited regardless of the address signal when one block corresponding to the one decoder is a bad block.

* * * * *